US011962292B1

(12) United States Patent
Pong et al.

(10) Patent No.: US 11,962,292 B1
(45) Date of Patent: Apr. 16, 2024

(54) GATE DRIVING DEVICE

(71) Applicant: Taipei ANJET Corporation, Taipei (TW)

(72) Inventors: Man Hay Pong, New Taipei (TW); Wen-Chin Wu, Taipei (TW)

(73) Assignee: TAIPEI ANJET CORPORATION, Taipei (TW)

( * ) Notice: Subject to any disclaimer, the term of this patent is extended or adjusted under 35 U.S.C. 154(b) by 0 days.

(21) Appl. No.: 17/975,797

(22) Filed: Oct. 28, 2022

(51) Int. Cl.
*H03K 17/567* (2006.01)
(52) U.S. Cl.
CPC .................................. *H03K 17/567* (2013.01)
(58) Field of Classification Search
CPC ..................................................... H03K 17/567
See application file for complete search history.

(56) References Cited

U.S. PATENT DOCUMENTS

| 6,026,005 | A  | * | 2/2000  | Abdoulin | H02M 3/33592 |
|-----------|----|---|---------|----------|--------------|
|           |    |   |         |          | 363/127      |
| 8,482,502 | B2 | * | 7/2013  | Kim      | G09G 3/3655  |
|           |    |   |         |          | 345/98       |
| 2019/0267793 | A1 | * | 8/2019  | Hematy | H02H 3/243 |
| 2021/0344342 | A1 | * | 11/2021 | Nojima | H03K 17/0822 |
| 2022/0271745 | A1 | * | 8/2022  | Culpin | H02H 3/085 |

* cited by examiner

*Primary Examiner* — Metasebia T Retebo
(74) *Attorney, Agent, or Firm* — Birch, Stewart, Kolasch & Birch, LLP

(57) ABSTRACT

A gate driving device includes an operational amplifier, two impedances, a multiplexer, and an UVLO circuit. The operational amplifier has an output coupled to the gate of the SiC MOSFET, a positive power terminal coupled to a positive power rail, and a negative power terminal coupled to a negative power rail. The impedances are coupled in series and coupled between the output of the amplifier and a low-voltage terminal. The UVLO circuit is coupled to the multiplexer and the positive power rail and coupled to the positive power voltage of the positive power rail, a driving voltage, and an UVLO voltage. The UVLO circuit controls the multiplexer to transmit an off voltage or an on voltage to the positive input of the operational amplifier based on the positive power voltage, the driving voltage, and the UVLO voltage, thereby turning on or off the SiC MOSFET.

8 Claims, 7 Drawing Sheets

GATE DRIVING DEVICE

BACKGROUND OF THE INVENTION

Field of the Invention

The invention relates to a driving device, particularly to a gate driving device for a SiC MOSFET.

Description of the Related Art

Silicon carbide is an emerging technology. SiC MOSFET has exceptionally low on resistance and low capacitances which can greatly reduce losses. It is able to improve performance significantly at high frequency in the medium to high power arena. It is very promising and is likely to open up many medium to high-power applications especially in the Electric Vehicle arena.

Silicon carbide MOSFET is so attractive that one might thought a direct drop in replacement of generic MOSFET or IGBT can instantly enhance the converter performance. However, examination shows there is actually some different demands in the driver of the SiC MOSFET as compared to generic MOSFET. Oversight of these issues might lead to undesirable effects or degraded performance. Device data show the on resistance is dependent on the gate source voltage Vgs in the whole range of the applicable voltage range, typically up to 20V. This is quite different from generic MOSFET where the on resistance is settled to its minimum value when Vgs is above 10 V. The SiC MOSFET does not have a distinct ohmic region which is different from its Si counterpart. The recommended Vgs is high at 18V near to the voltage limit.

On the other hand, the Vgs threshold voltage of SiC MOSFET drops considerably with temperature and it may become quite low. In order to ensure turn off it is recommended to apply a negative gate voltage to avoid unintended turn on due to parasitic oscillations. This changes gate drive requirement considerably and complicates the design as compared to the simple unregulated auxiliary gate drive gate for generic MOSFET. Nicely regulated auxiliary power supply is expected, together with a negative voltage. This impact on the converter system design as there may also be excessive heat dissipation during start up and shut down due to insufficient gate voltage. Under Voltage Lock Out (UVLO) is recommended but this contradicts the brownout and hold up requirement where the converter is expected to work under low input voltage.

SUMMARY OF THE INVENTION

It is an objective of the invention to provide a gate driving device, which generates regulated gate voltage for SiC devices by active feedback.

It is an objective of the invention to provide a gate driving device, which uses a single power source, rather than two, to provide positive and negative gate drive voltages.

It is an objective of the invention to provide a gate driving device, which uses unregulated power source as the single power source.

It is an objective of the invention to provide a gate driving device, which eliminates interconnection inductance and resistance effect by sense probing at the device gate terminal.

In an embodiment of the invention, a gate driving device is coupled to the gate of SiC metal-oxide-semiconductor field effect transistor (MOSFET). The SiC MOSFET is coupled between a high-voltage terminal and a low-voltage terminal. The gate driving device includes an operational amplifier, two impedances, a multiplexer, and an under voltage lock out (UVLO) circuit. The operational amplifier has an output coupled to the gate of the SiC MOSFET. The positive power terminal and the negative power terminal of the operational amplifier are respectively coupled to a positive power rail and a negative power rail. The positive power rail and the negative power rail respectively have a positive power voltage and a negative power voltage. The impedances are coupled in series and coupled between the output and the low-voltage terminal. A node between the impedances is coupled to the negative input of the operational amplifier. The multiplexer is coupled to the positive input of the operational amplifier and coupled to an off voltage and an on voltage. The UVLO circuit is coupled to the multiplexer and the positive power rail and coupled to the positive power voltage, a driving voltage, and an under voltage lock out (UVLO) voltage. The UVLO circuit is configured to control the multiplexer to transmit the off voltage or the on voltage to the positive input of the operational amplifier based on the positive power voltage, the driving voltage, and the UVLO voltage, thereby turning on or off the SiC MOSFET.

An embodiment of the invention deals with the case when isolation between the driver and the SiC MOSFET is needed. The gate driving device further includes a gate drive transformer and a driving source. This driving source serves two purposes, to provide power and driving signal to turn the SiC MOSFET on and off. This adds to the operational amplifier, multiplexer and UVLO arrangement so described.

Below, the embodiments are described in detail in cooperation with the drawings to make easily understood the technical contents, characteristics and accomplishments of the invention.

DETAILED DESCRIPTION OF THE INVENTION

Figure 1A:
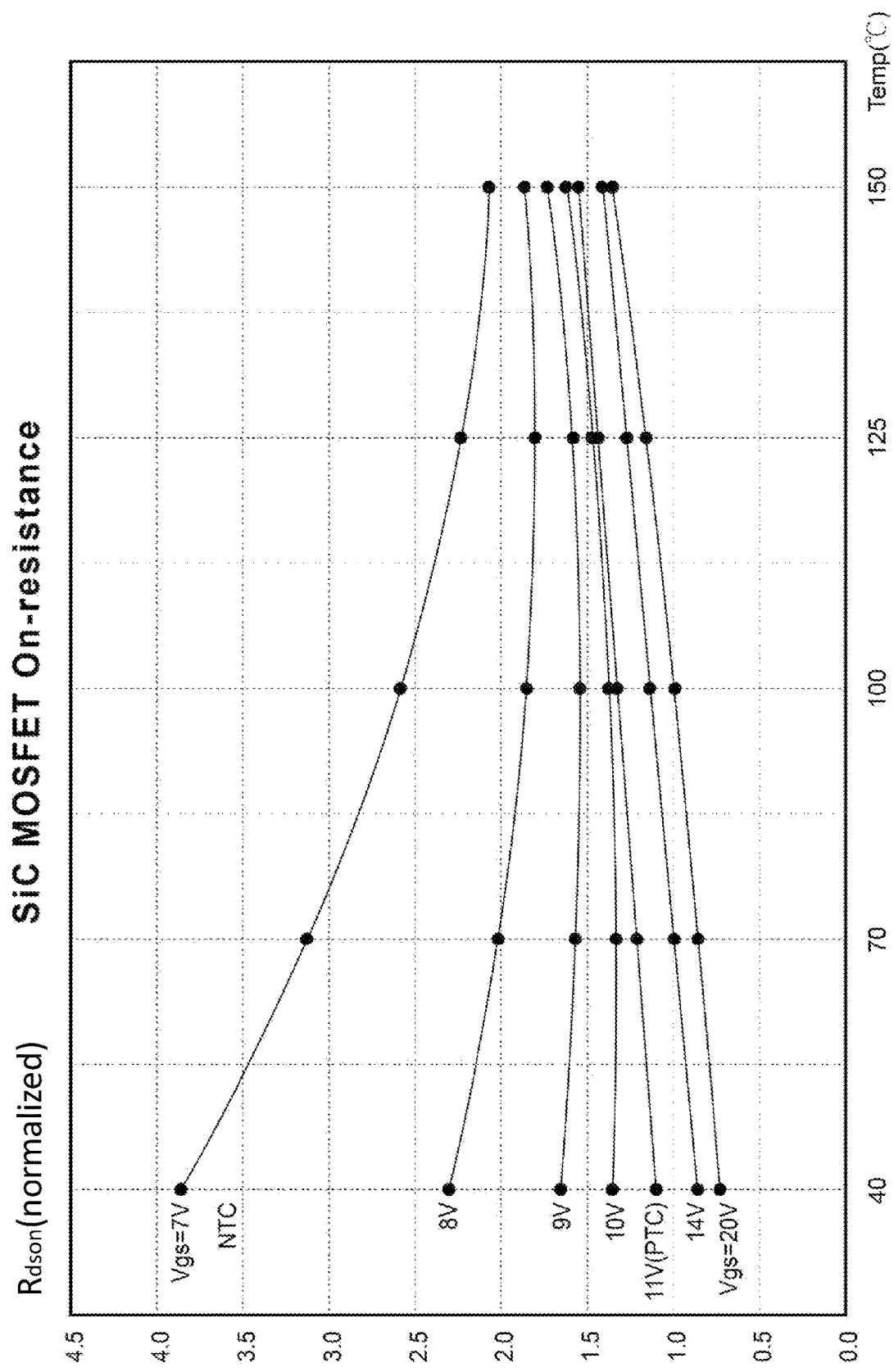
FIG. 1a is a diagram illustrating the variation of on-resistance Rdson of a SiC MOSFET with the temperature under the whole gate drive voltage range.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Comparison of the SiC and the Generic MOSFET

Figure 1B:
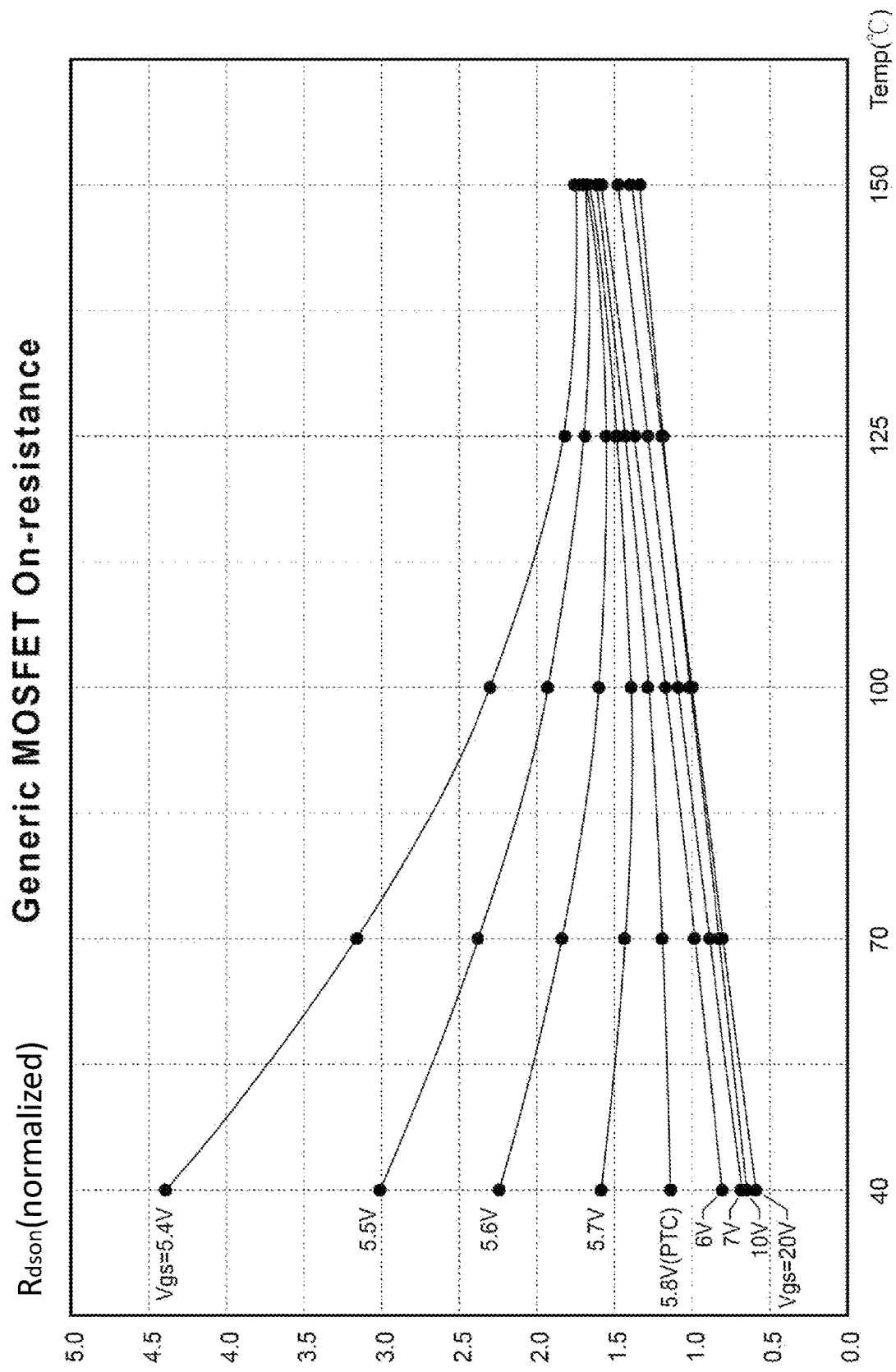
FIG. 1b is a diagram illustrating the variation of on-resistance Rdson of a generic MOSFET with the temperature under the whole gate drive voltage range.

Here are the characteristics of the SiC and generic MOSFET are compared. FIG. 1a shows the variation of on-resistance Rdson with the temperature under the whole gate drive voltage range. FIG. 1b shows a similar variation for a generic MOSFET. The measurements are taken with a resistor load with no voltage clamping to the drain-source (Vds). The on resistance values are normalized with the base resistance set as the fully on resistance at 100° C. for easy comparison between the two devices. At low gate voltage the on-resistance shows a negative temperature coefficient (NTC) where the resistance decreases with temperature. This is due to two competing factors. The on-resistance increases with temperature by its resistive nature. On the other hand, the gate threshold voltage decreases with temperature. In the negative temperature coefficient region the effect of threshold voltage is higher than the increase in resistance with temperature. It is observed that the SiC NTC region is wider than the generic MOSFET. In order to avoid thermal runaway, the gate voltage has to be sufficiently high, and obviously higher than that of generic MOSFET to operate in the positive temperature region.

Another observation from FIG. 1 is that generic MOSFET on-resistance has reached its minimum value for gate voltage beyond 10 V. However, SiC MOSFET on-resistance does not reach its minimum value even at the limit of the gate voltage. Such variation of on-resistance with Vgs shows SiC MOSFET needs a regulated gate voltage to avoid overheat due to insufficient gate voltage.

Figure 2:
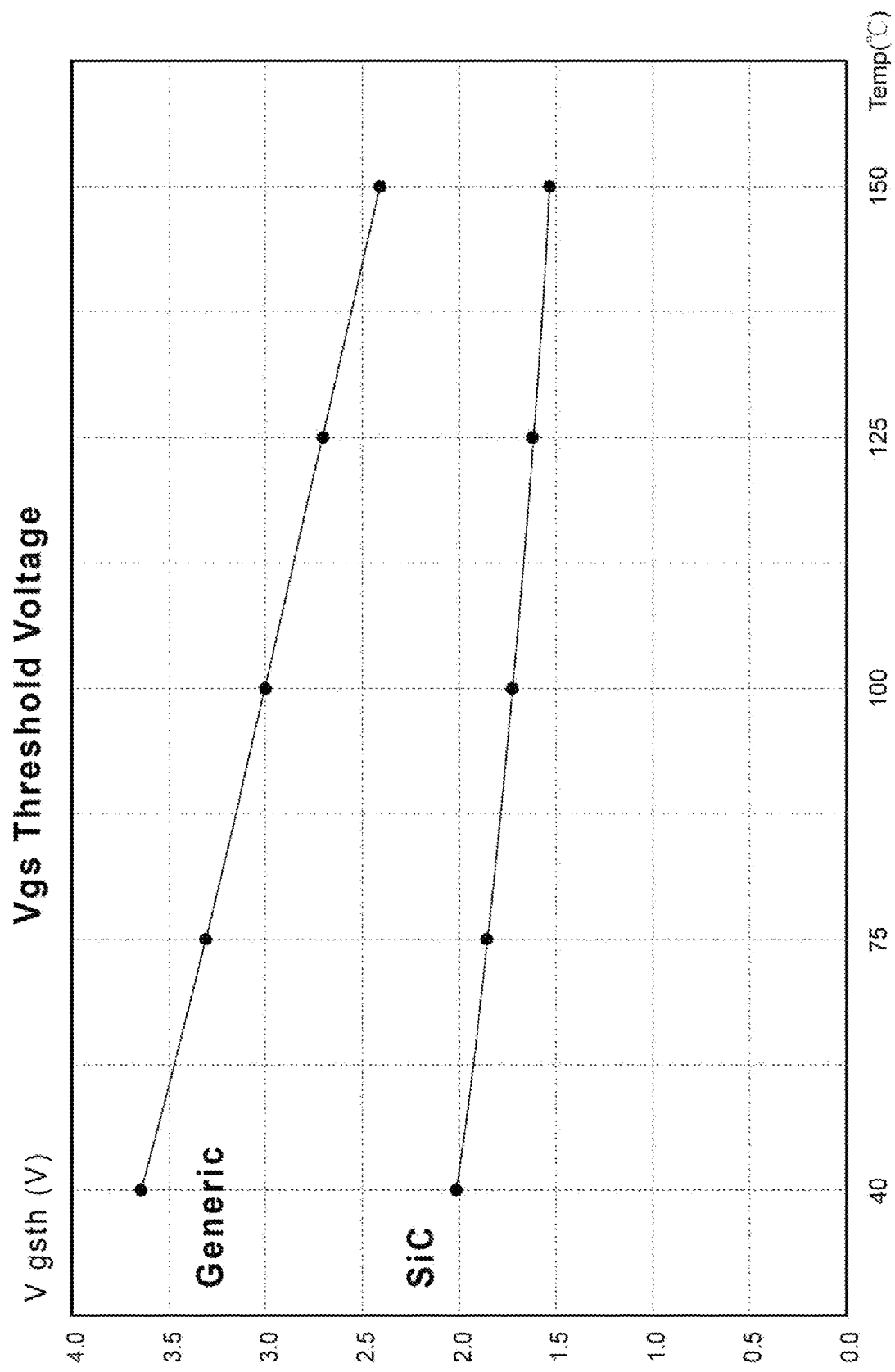
FIG. 2 is a diagram illustrating the variation of threshold voltages of a SiC MOSFET and a generic MOSFET with temperature.

FIG. 2 shows the variation of threshold voltages with temperature. It can be seen that the Vgsth decreases with temperature. SiC device Vgsth is as low as 1.8V at high temperature, which is much lower than the generic MOSFET. Therefore, it is recommended to provide a negative gate voltage to prevent undesirable turn on due to parasitic oscillations. This requirement of a negative gate drive definitely complicates gate drive design as it is not required in generic MOSFET. It has to be a separate negative voltage power source in addition to the auxiliary power supply.

Start Up, Shut Down and Brownout Requirements of a Power Supply

Figure 3:
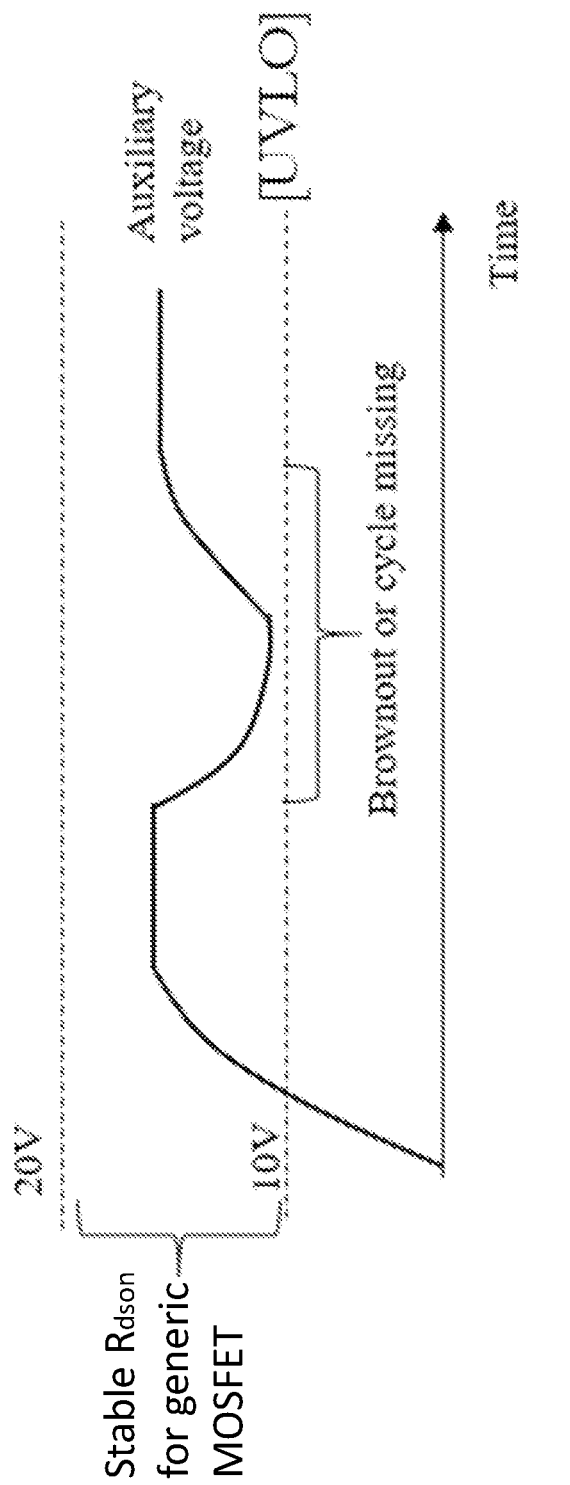
FIG. 3 is a diagram illustrating a stable Vgs range for a generic MOSFET.

For generic MOSFET a simple auxiliary power supply is often coupled from a winding in the main converter transformer. As this winding is directly coupled to the input voltage, the winding voltage is somehow unregulated, which is directly coupled to the gate drive voltage. For generic MOSFET such gate voltage variation can be absorbed in the wide range between 10 V and 20 V in which the MOSFET operates at its minimum on resistance, as shown in FIG. 3. If the Under Voltage Lock Out (UVLO) level is sent to 10 volt, during start up, shut down or brown out the gate voltage is allowed to operate above 10 V, and allowed to rise to a higher radio without affecting the device dissipation as the minimum Rdson is attained above 10V gate voltage. For SiC MOSFET such variation range is reduced to 18 V to 20 V, or less. In order for the device to operate at this designated on-resistance a tightly regulated gate voltage together with UVLO set at 18V is necessary. The simple unregulated auxiliary power circuit cannot be used. In order to cope with hold up time and brownout and requirement, the input voltage range has to be sufficiently wide while maintaining the regulated output. The gate drive is actually a power supply within a power supply.

An Operational Amplifier Based Gate Drive Circuit is Proposed

Figure 4:
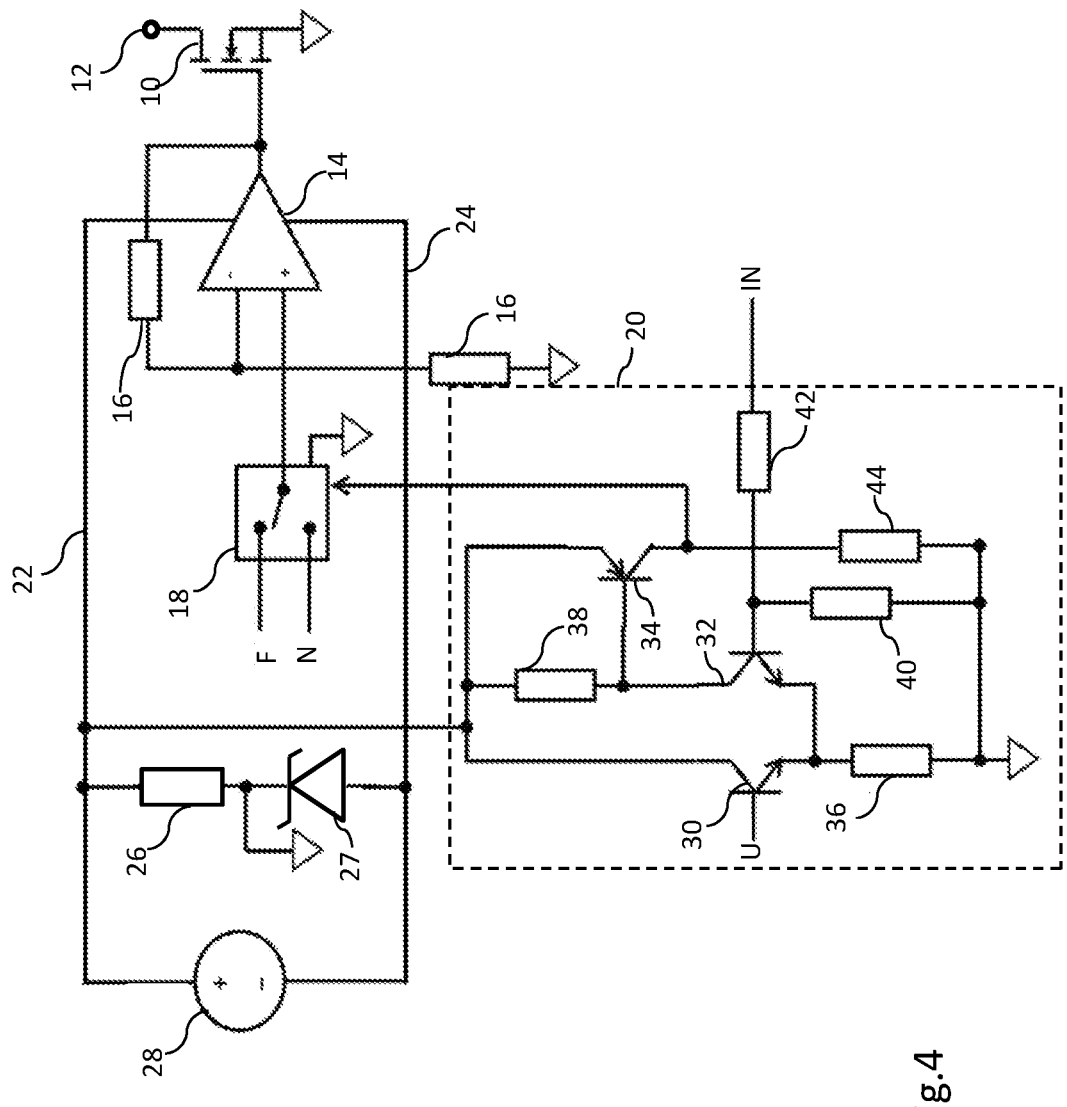
FIG. 4 is a diagram illustrating a gate driving device according to a first embodiment of the invention.

Referring to FIG. 4, the first embodiment of the invention is introduced as follows. A gate driving device is coupled to the gate of a SiC metal-oxide-semiconductor field effect transistor (MOSFET) 10. The SiC MOSFET 10 is coupled between a high-voltage terminal 12 and a low-voltage terminal. For example, the low-voltage terminal may be a grounding terminal. The SiC MOSFET 10 may be an N-channel MOSFET or a P-channel MOSFET. The first embodiment exemplifies the SiC MOSFET 10 with an N-channel MOSFET. The gate driving device includes an operational amplifier 14, two impedances 16, a multiplexer 18, and an under voltage lock out (UVLO) circuit 20. The impedances 16 are typically resistors but they can also be circuits appropriate for proper compensation of the operational amplifier 14. The operational amplifier 14 has an output coupled to the gate of the SiC MOSFET 10. The positive power terminal and the negative power terminal of the operational amplifier 14 are respectively coupled to a positive power rail 22 and a negative power rail 24. The impedances 16 are coupled in series and coupled between the output of the operational amplifier 14 and the low-voltage terminal A node between the first resistors 16 is coupled to the negative input of the operational amplifier 14. The multiplexer 18 is coupled to the positive input of the operational amplifier 14. The UVLO circuit 20 is coupled to the multiplexer 18 and the positive power rail 22.

The positive power rail 22 and the negative power rail 24 respectively have a positive power voltage and a negative power voltage. The multiplexer 18 is coupled to an off voltage F and an on voltage N. The UVLO circuit 20 is coupled to the positive power voltage, a driving voltage IN, and an under voltage lock out (UVLO) voltage U. The UVLO circuit 20 controls the multiplexer 18 to transmit the off voltage F or the on voltage N to the positive input of the operational amplifier 14 based on the positive power voltage, the driving voltage IN, and the UVLO voltage U, thereby turning on or off the SiC MOSFET 10. The gate driving device may further include a totem pole circuit or otherwise coupled to the gate of the SiC MOSFET 10 and the output of the operational amplifier 14 for enhancing driving capability.

Voltage sensing at the gate of the SiC MOSFET 10 is made available by connecting one terminal of the resistor 16 right at the device gate. This bypass the voltage error brought about by the gate interconnection stray inductance. Provide the supply rail voltage is high the gate capacitance can be charged quickly. This provides tight control of the gate voltage. This arrangement can also eliminate Miller capacitance effect and avoid false triggering of the device.

The operational amplifier 14 has its reference input coupled to a multiplexer 18 which gives two choices of reference voltages, for ON and OFF respectively at the command of driving voltage IN. There may be more than two choices of reference voltages for versatile control. The default level is OFF and switch to ON at the command of driving voltage IN.

In some embodiments of the invention, the gate driving device may further include a resistor 26, a regulator device 27, and a direct-current (DC) voltage source 28. The resistor 26 and the regulator device 27 are coupled in series and coupled between the positive power rail 22 and the negative power rail 24. A node between the resistor 26 and the regulator device 27 is coupled to the low-voltage terminal. The DC voltage source 28, coupled to the positive power rail 22 and the negative power rail 24, provides the positive power voltage and the negative power voltage through the resistor 26 and the regulator device 27.

The power supply comes from a single DC voltage source 28. A constant voltage is maintained across the regulator device 27. The embodiment exemplifies the regulator device 27 although other devices serving the same function can also be used. The node between the resistor 26 and the regulator device 27 is taken as a virtual ground node or reference zero voltage of the circuit. The DC voltage source 28 provides positive and negative voltages to drive the SiC MOSFET 10 ON and OFF with respect to the virtual ground. The power source can be unregulated provided its voltage is higher than the required output.

Furthermore, in order to protect the SiC MOSFET 10 from being driven by insufficient voltage, three UVLO circuit 20 in FIG. 4 is used. Command to switch the SiC MOSFET 10 is issued at IN. The actual drive signal to turn on the SiC MOSFET 10 is issued only if both the supply rail voltage and the IN command are sufficiently high. The UVLO circuit 20 may include a first NPN bipolar junction transistor (BJT) 30, a second NPN bipolar junction transistor (BJT) 32, and a PNP bipolar junction transistor (BJT) 34. The first NPN BJT 30 has a base coupled to the UVLO voltage U, a collector coupled to the positive power rail 22, and an emitter coupled to the virtual ground node as the low-voltage terminal through a second resistor 36. The second NPN BJT 32 has an emitter coupled to a node between the emitter of the first NPN BJT 30 and the second resistor 36 and a collector coupled to the positive power rail 22 through a third resistor 38. The base of the second NPN BJT 32 is coupled to the virtual ground node through a fourth resistor 40 and coupled to the driving voltage IN through a fifth resistor 42. The PNP BJT 34 has a base coupled to a node between the third resistor 38 and the collector of the second NPN BJT 32, an emitter coupled to the positive power rail 22, and a collector coupled to the multiplexer 18 and coupled to the low-voltage terminal through a sixth resistor 44.

The multiplexer 18 transmits the on voltage N to the positive input of the operational amplifier 14 to turn on the SiC MOSFET 10 when the driving voltage IN is greater than UVLO voltage U and the positive power voltage turns on the PNP BJT 34. The multiplexer 18 transmits the off voltage F to the positive input of the operational amplifier 14 to turn off the SiC MOSFET 10 when the positive power voltage brings the PNP BJT 34 to operate in its cut-off region. This serves the protection purpose when the supply voltage 28 is insufficient to drive the SiC MOSFET 10, at least during start up, brownout or shutdown.

Figure 5:
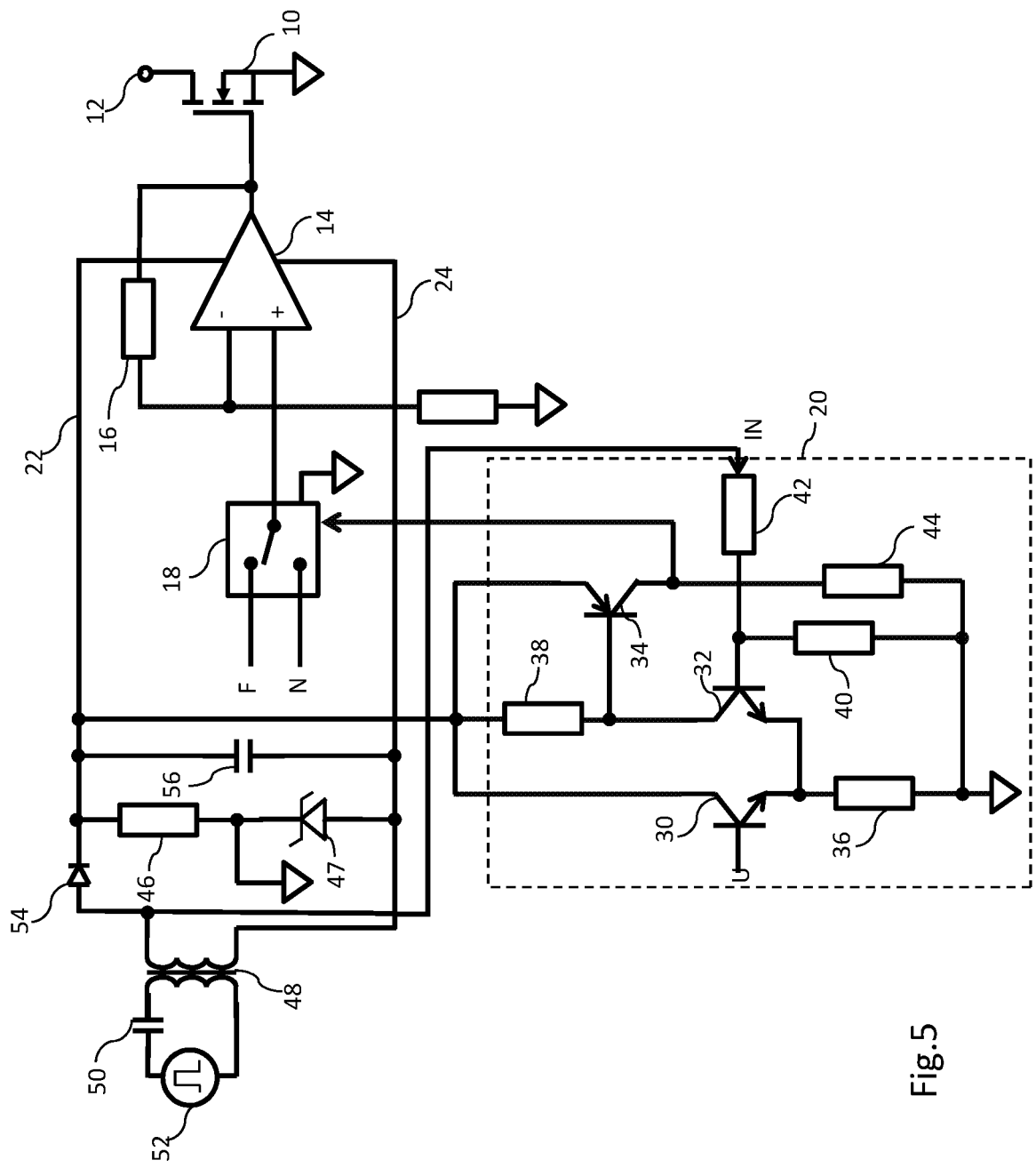
FIG. 5 is a diagram schematically illustrating a gate driving device according to a second embodiment of the invention.

Referring to FIG. 4 and FIG. 5, the second embodiment of the invention is introduced as follows. The second embodiment uses a resistor 46, a regulator device 47, a transformer 48, a first capacitor 50, a pulsating (AC) voltage source 52, a diode 54, and a second capacitor 56, to replace the resistor 26, the regulator device 27, and the DC voltage source 28 of the first embodiment. In the second embodiment, the resistor 46 and the regulator device 47 are coupled in series and coupled between the positive power rail 22 and the negative power rail 24. A node between the resistor 46 and the regulator device 47 is coupled to the low-voltage terminal taken as virtual ground. The transformer 48 has a primary side coupled to the second capacitor 50. The secondary side of the transformer 48 has a first end and a second end. The first end of the secondary side is coupled to the fifth resistor 42 of the UVLO circuit 20. The second end of the secondary side is coupled to the virtual ground. The pulsating AC voltage source 52 is coupled to the primary side of the transformer 48 through the first capacitor 50. This pulsating AC voltage source 52 provides power to the circuit as well as driving signal. The diode 54 has an anode coupled to the first end of the secondary side and a cathode coupled to the positive power rail 22. The second capacitor 56 is coupled between the positive power rail 22 and the negative power rail 24. The AC voltage source 52 provides the driving voltage IN, the positive power voltage, and the negative power voltage through the first capacitor 50, the diode 54, the resistor 46, and the regulator device 47.

The transformer 48 in FIG. 5 acts as power supply to the drive circuit in addition to the duty cycle. This embodiment provides galvanic isolation, say, for driving high side device in a bridge configuration. The transformer 48 can have multiple secondary windings. This allows versatile applications such as series connected devices.

Figure 6:
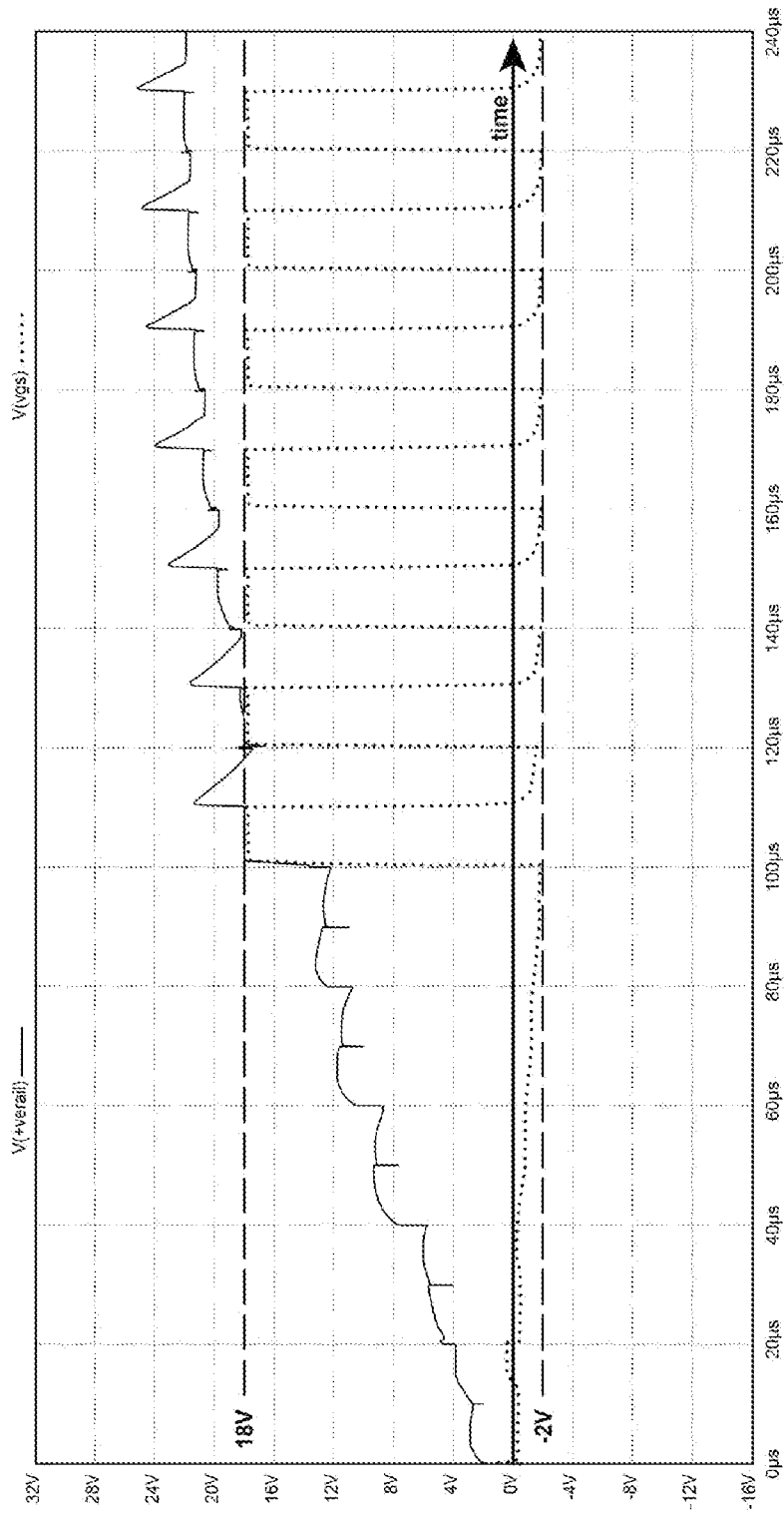
FIG. 6 is a diagram schematically illustrating the simulation waveforms of a Vgs and a positive power rail according to an embodiment of the invention.

Simulation circuit of the transformer coupled drive is shown in FIG. 5. Simulation result is shown in FIG. 6. The dashed line and the solid line of FIG. 6 respectively represent the positive power voltage of the positive power rail 22 and the Vgs of the SiC MOSFET 10 in FIG. 5. Referring to FIGS. 4-6, the driving pulses and the positive and negative rail voltages during startup are shown. It can be seen that when the supply rail voltages are not sufficient output gate pulses are inhibited. After the rail voltages have risen to and above sufficient values the gate pulses are regulated as designed.

In conclusion, the gate drive requirement is somehow different from generic MOSFET. The threshold voltage is rather low especially at high temperature so it needs a negative voltage gate voltage to maintain turn off. As the gate voltage increases the on-resistance decrease but there is no clear ohmic region. The on-resistance keeps decreasing with gate voltage, which is different from its generic counterpart which settles to its minimum value beyond 10 V. This presents a need for regulated gate voltage and negative voltage supply. This requirement increases converter configuration complexity. Here in the invention an opamp gate drive is presented. It can produce regulated positive and negative voltage needed to drive the SiC MOSFET on and off without a tightly regulated wide range auxiliary power supply. The invention restores the simplicity of converter configuration like that of the generic MOSFET.

The embodiments described above are only to exemplify the invention but not to limit the scope of the invention. Therefore, any equivalent modification or variation according to the shapes, structures, features, or spirit disclosed by the invention is to be also included within the scope of the invention.

What is claimed is:

1. A gate driving device coupled to a gate of a SiC metal-oxide-semiconductor field effect transistor (MOSFET), the SiC MOSFET coupled between a high-voltage terminal and a low-voltage terminal, and the gate driving device comprising:
    an operational amplifier having an output coupled to the gate of the SiC MOSFET, wherein a positive power terminal and a negative power terminal of the operational amplifier are respectively coupled to a positive power rail and a negative power rail, and the positive power rail and the negative power rail respectively have a positive power voltage and a negative power voltage;
    two impedances coupled in series and coupled between the low-voltage terminal and each of the output of the operational amplifier and the gate of the SiC MOSFET, wherein a node between the impedances is coupled to a negative input of the operational amplifier;
    a multiplexer coupled to a positive input of the operational amplifier and coupled to an off voltage and an on voltage; and
    an under voltage lock out (UVLO) circuit coupled to the multiplexer and the positive power rail and configured to input the positive power voltage, a driving voltage, and an under voltage lock out (UVLO) voltage, wherein the UVLO circuit is configured to control the multiplexer to transmit the off voltage or the on voltage to the positive input of the operational amplifier based on the positive power voltage, the driving voltage, and the UVLO voltage, thereby turning on or off the SiC MOSFET.

2. The gate driving device according to claim 1, wherein the UVLO circuit comprises:
    a first NPN bipolar junction transistor (BJT) having a base coupled to the UVLO voltage, a collector coupled to the positive power rail, and an emitter coupled to the low-voltage terminal through a second resistor;
    a second NPN bipolar junction transistor (BJT) having an emitter coupled to a node between the emitter of the first NPN BJT and the second resistor and a collector coupled to the positive power rail through a third resistor, wherein a base of the second NPN BJT is coupled to the low-voltage terminal through a fourth resistor and coupled to the driving voltage through a fifth resistor; and
    a PNP bipolar junction transistor (BJT) having a base coupled to a node between the third resistor and the collector of the second NPN BJT, an emitter coupled to the positive power rail, and a collector coupled to the multiplexer and coupled to the low-voltage terminal through a sixth resistor.

3. The gate driving device according to claim 2, wherein the multiplexer transmits the on voltage to the positive input of the operational amplifier to turn on the SiC MOSFET when the driving voltage is greater than UVLO voltage and the positive power voltage turns on the PNP BJT, and the multiplexer transmits the off voltage to the positive input of the operational amplifier to turn off the SiC MOSFET when the positive power voltage brings the PNP BJT to operate in its cut-off region.

4. The gate driving device according to claim 1, further comprising:
    a resistor and a regulator device coupled in series and coupled between the positive power rail and the negative power rail, wherein a node between the resistor and the regulator device is coupled to the low-voltage terminal; and
    a direct-current (DC) voltage source coupled to the positive power rail and the negative power rail and configured to provide the positive power voltage and the negative power voltage through the resistor and the regulator device.

5. The gate driving device according to claim 1, further comprising:
    a resistor and a regulator device coupled in series and coupled between the positive power rail and the negative power rail, wherein a node between the resistor and the regulator device is coupled to the low-voltage terminal;
    a transformer having a primary side coupled to a first capacitor, wherein a secondary side of the transformer has a first end and a second end, the first end of the secondary side is coupled to the UVLO circuit, and the second end of the secondary side is coupled to the low-voltage terminal;
    a pulsating alternating-current (AC) voltage source coupled to the primary side through the first capacitor;
    a diode having an anode coupled to the first end of the secondary side and a cathode coupled to the positive power rail; and
    a second capacitor coupled between the positive power rail and the negative power rail;
    wherein the AC voltage source is configured to provide the driving voltage, the positive power voltage, and the negative power voltage through the first capacitor, the diode, the resistor, and the regulator device.

6. The gate driving device according to claim 1, further comprising a totem pole circuit coupled to the gate of the SiC MOSFET and the output of the operational amplifier.

7. The gate driving device according to claim 1, wherein the low-voltage terminal is a grounding terminal.

8. The gate driving device according to claim 1, wherein the SiC MOSFET is an N-channel MOSFET or a P-channel MOSFET.

* * * * *